(12) United States Patent
Fukuhara

(10) Patent No.: US 7,030,445 B2
(45) Date of Patent: Apr. 18, 2006

(54) POWER MOSFET, POWER MOSFET PACKAGED DEVICE, AND METHOD OF MANUFACTURING POWER MOSFET

(75) Inventor: Kazuya Fukuhara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/849,035

(22) Filed: May 20, 2004

(65) Prior Publication Data

US 2005/0012117 A1    Jan. 20, 2005

(30) Foreign Application Priority Data

May 20, 2003   (JP)   ............................. 2003-142165

(51) Int. Cl.
  *H01L 29/76*   (2006.01)
  *H01L 29/94*   (2006.01)
  *H01L 31/062*  (2006.01)
  *H01L 31/113*  (2006.01)
  *H01L 29/00*   (2006.01)

(52) U.S. Cl. ........................ 257/328; 257/329; 257/513

(58) Field of Classification Search ........ 257/328–329, 257/513
See application file for complete search history.

(56) References Cited

U.S. PATENT DOCUMENTS

| | | | |
|---|---|---|---|
| 3,577,019 A * | 5/1971 | Storm ........................ 327/541 |
| 4,831,424 A * | 5/1989 | Yoshida et al. ................ 257/49 |
| 4,984,051 A * | 1/1991 | Yoshida ....................... 257/690 |
| 5,866,947 A * | 2/1999 | Wang et al. .................. 257/764 |
| 6,423,623 B1 * | 7/2002 | Bencuya et al. ............. 438/612 |
| 6,562,647 B1 * | 5/2003 | Zandman et al. .............. 438/33 |

FOREIGN PATENT DOCUMENTS

| | | |
|---|---|---|
| JP | 6-326365 | 11/1994 |
| JP | 11-177007 | 7/1999 |
| JP | P2002-359332 A | 12/2002 |

* cited by examiner

*Primary Examiner*—Steven Loke
*Assistant Examiner*—Samuel A Gebremariam
(74) *Attorney, Agent, or Firm*—McDermott Will & Emery LLP

(57) ABSTRACT

A source terminal layer, a gate terminal layer, and a drain terminal layer are disposed on main surfaces, opposite to each other, on main surfaces of a semiconductor substrate. These terminal layers are laid out on the respective main surfaces with such sizes as to fall within the areas of the respective main surfaces and joined to their corresponding source, gate, and drain electrodes. A power MOSFET is packaged on a circuit board such that the respective main surfaces intersect substantially at right angles to the circuit board. By a terminal board isolating step or a method of evaporating a metal layer onto the source, gate, and drain electrodes, the power MOSFET is formed with the source terminal layer, gate terminal layer, and drain terminal layer at the stage of a semiconductor wafer.

3 Claims, 9 Drawing Sheets

(a)

(b)

(a)

(b)

(a)

(b)

(a)

(b)

(a)

(b)

POWER MOSFET, POWER MOSFET PACKAGED DEVICE, AND METHOD OF MANUFACTURING POWER MOSFET

FIELD OF THE INVENTION

The present invention relates to a power MOSFET, a power MOSFET packaged device, and a method of manufacturing the power MOSFET.

BACKGROUND ART

In a power MOSFET, a source electrode and a gate electrode are normally laid out on one main surface of a semiconductor substrate, and a drain electrode is placed on the other main surface of the semiconductor substrate. The power MOSFET is packaged by joining the drain electrode to a die bond area of a lead frame. The die bond area of the lead frame forms a drain terminal, and the lead frame includes a source terminal and a gate terminal electrically isolated from the die bond area. The source electrode and gate electrode of the power MOSFET are connected to their corresponding source and gate terminals through slender metal wires. The source electrode is connected to the source terminal via a plurality of slender metal wires to reduce on resistance.

A semiconductor package having built therein a semiconductor chip containing vertical MOS transistor is shown in FIG. 17 of Japanese Patent Laid-open No. 2002-359332. In the semiconductor package, metal electrodes lying on the chip are connected to their corresponding leads via a plurality of Au wires to reduce the wiring resistances of wires. In this case, the present publication describes that as the number of electrode pads increases and the connected number of Au wires increases, the number of indexes in an assembly process increases, and a further reduction in wiring resistance becomes difficult due to the wire lengths.

Further, FIG. 1 of Japanese Patent Laid-open No. 2002-359332 shows a structure wherein conductive strip leads are joined to bump contacts on a semiconductor chip. Since the leads constituted of the conductive strips are directly joined to the bump contacts, the wiring resistance can be reduced as compared with one that uses slender metal wires.

In the structure shown in FIG. 1 of Japanese Patent Laid-open No. 2002-359332, however, the two leads comprising the conductive strips are disposed on the semiconductor chip. Further, there is a need to mount these leads to the semiconductor chip respectively upon assembly.

SUMMARY OF THE INVENTION

Accordingly, it is an object of the present invention to provide a power MOSFET in which a source terminal layer, a gate terminal layer, and a drain terminal layer are disposed on main surfaces of a semiconductor substrate. The power MOSFET is improved so as to achieve its downsizing and a reduction in connecting resistance of each of those terminal layers.

It is another object of the invention to provide a power MOSFET packaged device, which packages such an improved power MOSFET in a smaller packaging area.

Further, It is another object of the invention to provide a method of manufacturing a power MOSFET, which is capable of improving a process for forming a source terminal, a gate terminal, and a drain terminal, and easily forming these terminals.

According to one aspect of the present invention, a power MOSFET comprises a semiconductor substrate, a source terminal layer, a gate terminal layer and a drain terminal layer.

The semiconductor substrate has one main surface and the other main surface opposite to each other, and the semiconductor substrate has a source electrode and a gate electrode provided on the one main surfaces and a drain electrode provided on the other main surface. The source terminal layer is disposed on the one main surface and joined to the source electrode. The gate terminal layer is disposed on the one main surface and joined to the gate electrode. The drain terminal layer is disposed on the other main surface and joined to the drain electrode. Further, the source terminal layer and the gate terminal layer are respectively disposed on the one main surface with such sizes as to fall within the area of the one main surface, and the drain terminal layer is disposed with such a size as to fall within the area of the other main surface.

According to another aspect of the present invention, a power MOSFET packaged device comprises a power MOSFET as described above and a circuit board. Further, the power MOSFET is packaged in such a manner that the respective main surfaces of the semiconductor substrate in the power MOSFET are substantially normal to a circuit board.

According to other aspect of the present invention, in a method of manufacturing a plurality of power MOSFETs, a semiconductor wafer is prepared that includes a plurality of power MOSFETs each having a semiconductor substrate, a source electrode and a gate electrode on one main surface of the semiconductor substrate and a drain electrode on the other main surface thereof. Then, a first terminal board is formed that contacts in common with the source electrode and the gate electrode of each power MOSFET contained in the semiconductor wafer, and a second terminal board is formed that contacts in common with the drain electrode of said each power MOSFET contained in the semiconductor wafer. Then, the semiconductor wafer is divided in association with the power MOSFETs and thereby constituted are the power MOSFETs each having, on the one main surface side of the semiconductor substrate, a source terminal layer and a gate terminal layer respectively brought into contact with the source electrode and the gate electrode, and having, on the other main surface side, a drain terminal layer brought into contact with the drain electrode.

According to other aspect of the present invention, in a method of manufacturing a plurality of power MOSFETs, a semiconductor wafer is prepared that includes a plurality of the power MOSFETs each having a semiconductor substrate, a source electrode and a gate electrode on the side of one main surface of the semiconductor substrate and a drain electrode on the side of the other main surface thereof. Then, formed are the source terminal layers, gate terminal layers, and drain terminal layers, after the wafer preparing step, by evaporating a metal layer onto the source electrodes, gate electrodes, and drain electrodes of the respective power MOSFETs contained in the semiconductor wafer. Then, the semiconductor wafer is divided, after the terminal layer forming step, in association with the respective power MOSFETs to thereby constitute the individual power MOSFETs.

Other and further objects, features and advantages of the invention will appear more fully from the following description.

DETAILED DESCRIPTION OF THE PREFERRED EMBODIMENTS

First Embodiment

Figure 1:
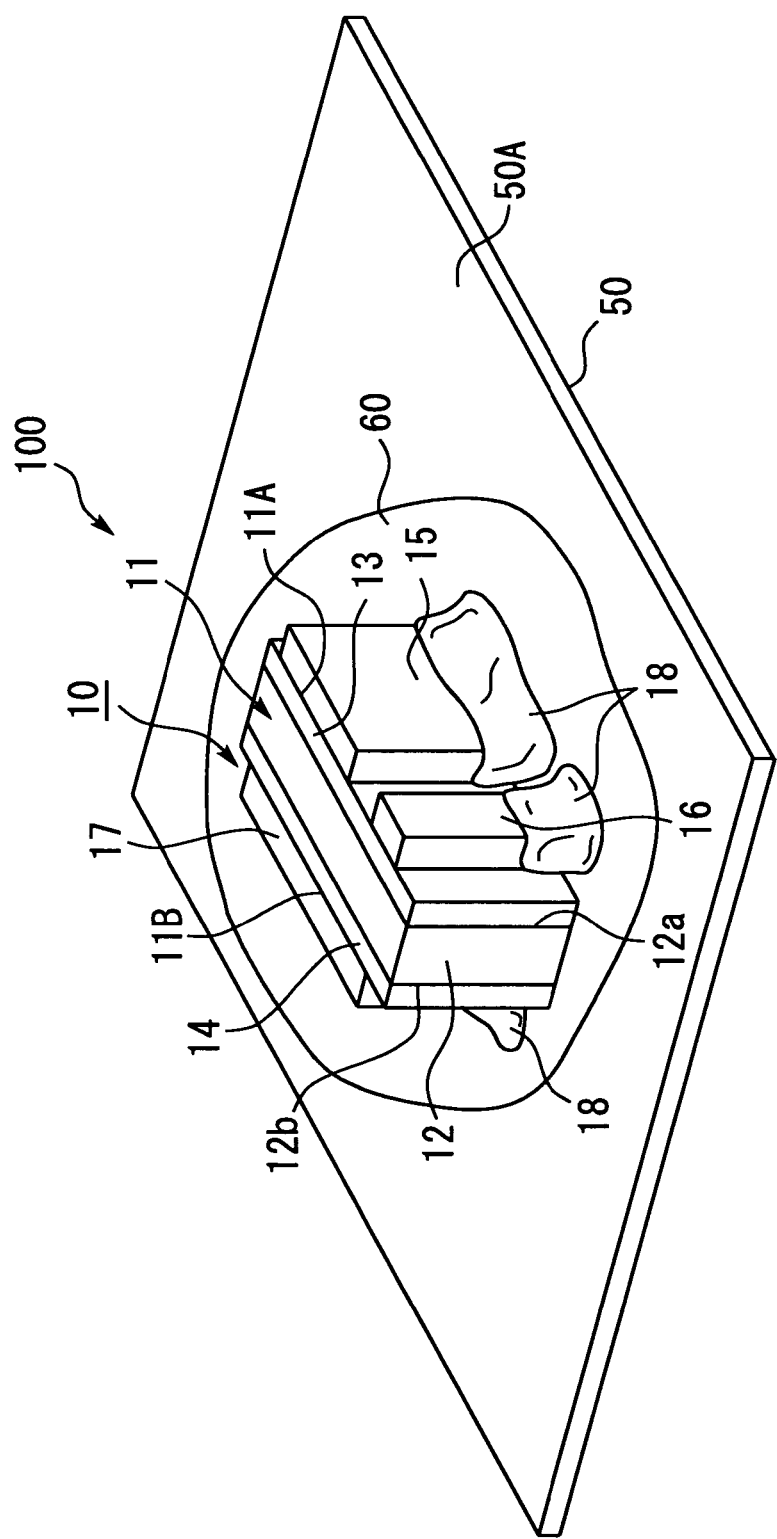
FIG. 1 shows an embodiment of a power MOSFET packaged device containing a power MOSFET according to a first embodiment of the present invention.

FIG. 1 shows an embodiment of a power MOSFET application device containing a power MOSFET according to the present invention. In FIG. 1, there is shown a power MOSFET application device 100 that includes a power MOSFET 10 according to the present invention and a circuit substrate 50. FIG. 1 shows a perspective view through a resin material that covers and seals the power MOSFET 10 onto the circuit substrate 50.

The power MOSFET 10 shown in FIG. 1 will be described now. The power MOSFET 10 includes a semiconductor substrate 11, a source terminal layer 15, a gate terminal layer 16, and a drain terminal layer 17. The semiconductor substrate 11 is also called as a "semiconductor chip". The semiconductor substrate 11 has a silicon substrate layer 12 and surface layers 13 and 14 constituted of, for example, silicon. The semiconductor substrate 11 has a main surface 11A and a main surface 11B opposite to each other. The silicon substrate layer 12 has main surfaces 12a and 12b. The surface layers 13 and 14 are respectively formed on these main surfaces 12a and 12b. The surfaces of the surface layers 13 and 14 correspond to the main surfaces 11A and 11B of the semiconductor substrate 11, respectively.

Figure 2:
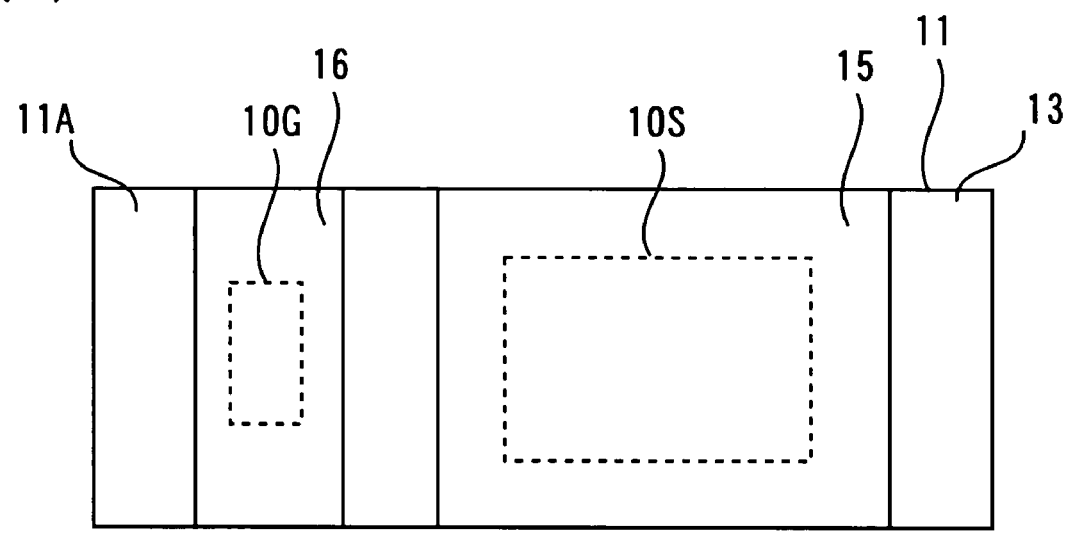
FIGS. 2(a) and 2(b) show each surface of a semiconductor substrate of the power MOSFET according to a first embodiment of the present invention.
Figure 2:
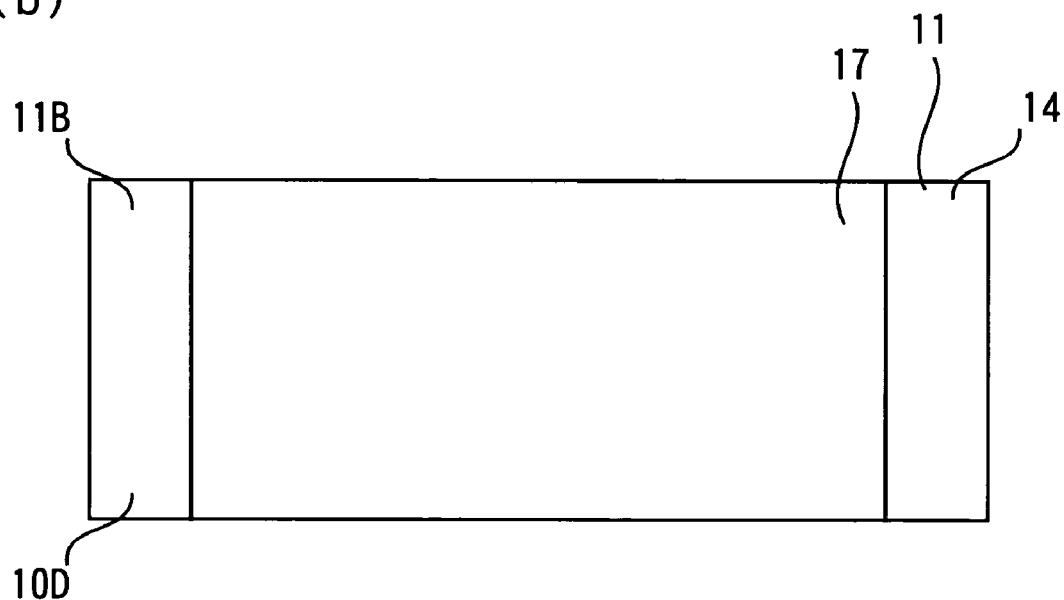

FIGS. 2(a) and 2(b) show both main surfaces of the semiconductor substrate 11 of the power MOSFET 10, wherein FIG. 2(a) illustrates the surface layer 13 at the main surface 11A, and FIG. 2(b) depicts the surface layer 14 at the main surface 11B, respectively.

A source electrode 10S and a gate electrode 10G of the power MOSFET 10 are formed within the surface layer 13 so as to be exposed onto the main surface 11A. The source electrode 10S is brought into ohmic contact with a source region formed in the main surface 12a of the silicon substrate layer 12. The gate electrode 10G is placed so as to be opposite to a channel region formed in the main surface 12a of the silicon substrate layer 12 with a thin gate insulating film interposed therebetween. The source electrode 10S is configured so as to have an area larger than that of the gate electrode 10G.

The source terminal layer 15 is disposed on the main surface 11A and joined onto the source electrode 10S with a conductive adhesive interposed therebetween. The gate terminal layer 16 is also disposed on the main surface 11A and joined onto the gate electrode 10G with a conductive adhesive interposed therebetween.

A drain region of the power MOSFET 10 is formed in the main surface 12b of the silicon substrate layer 12 substantially over its whole surface. The surface layer 14 includes a drain electrode 10D brought into ohmic contact with the drain region. The drain terminal layer 17 is disposed on the main surface 11B and bonded onto the drain electrode 10D with a conductive adhesive.

The source terminal layer 15, the gate terminal layer 16, and the drain terminal layer 17 are respectively constituted of a Cu or Cu alloy such as Cu—Sn, Cu—Sn—Ni, etc.

The power MOSFET 10 is configured in such a manner that the semiconductor substrate 11 is interposed among the source terminal layer 15, the gate terminal layer 16, and the drain terminal layer 17. The source terminal layer 15 and the gate terminal layer 16 are placed on the main surface 11A side by side with their sizes falling within the area of the main surface 11A. The layers 15 and 16 are disposed on the main surface 11A without being protruded outside the main surface 11A. The drain terminal layer 17 is placed on the main surface 11B so as to be opposite to the source terminal layer 15 and the gate terminal layer 16. The drain terminal layer 17 also has such a size so as to fall within the area of the main surface 11B and is disposed on the main surface 11B without extending out from the main surface 11B.

Such a configuration of the power MOSFET 10 according to the first embodiment is effective in downsizing the power MOSFET 10. In a conventional art, the drain electrode contained in the surface layer 14 of the semiconductor substrate 11 is joined onto its corresponding die bond area of the lead frame, the drain terminal extending from the die bond area to the outside is formed, and the source and gate terminals that extend toward the side opposite to the drain terminal are formed. As a result, the lead frame greatly extends toward both sides of the semiconductor substrate from the semiconductor substrate and hence its outer dimensions become large. In contrast, in such a power MOSFET 10 as shown in the first embodiment, the outer dimensions of the power MOSFET 10 can be scaled down because the source terminal layer 15, the gate terminal layer 16, and the drain terminal layer 17 are disposed within the areas of the main surfaces 11A and 11B of the semiconductor substrate 11.

In the power MOSFET 10 according to the first embodiment, such a configuration that the source terminal layer 15, the gate terminal layer 16, and the drain terminal layer 17 are respectively joined to the source electrode 10S, the gate electrode 10G, and the drain electrode 10D with the conductive adhesives, eliminates the need for the connection between the source terminal layer 15 and the gate terminal layer 16 by means of thin metal wires. Therefore, the resistances of connections among the source terminal layer 15, the gate terminal layer 16, and the drain terminal layer 17, and the source electrode 10S, the gate electrode 10G, and the drain electrode 10D can be sufficiently reduced. Thus, the power MOSFET 10 can efficiently be operated with small internal resistance.

As shown in FIG. 1, the power MOSFET 10 in the first embodiment is disposed on an upper main surface 50A of a circuit board 50. The power MOSFET 10 is placed on the upper main surface 50A of the circuit board 50 in such a manner that the main surfaces 11A and 11B thereof become substantially normal to the upper main surface 50A of the circuit board 50 in particular. In addition, the power MOSFET 10 is brazed to the upper main surface 50A with brazing materials 18. The brazing materials 18 are solder, for example. A resin material 60 is placed on the circuit board 50 for sealing the power MOSFET 10. After packaging the power MOSFET 10 on the circuit board 50, and fixedly securing the power MOSFET 10 thereto with the brazing materials 18, the resin material 60 is potted so as to cover the power MOSFET 10. The resin material 60 prevents penetration of moisture or the like into the power MOSFET 10, stably activates the power MOSFET 10, and radiates heat from the power MOSFET 10 concurrently.

In the first embodiment, the power MOSFET 10 is packaged onto the main surface 50A such that the main surfaces 11A and 11B of the power MOSFET 10 become substantially normal to the main surface 50A of the circuit board 50. This is effective in reducing the area necessary to package the power MOSFET 10 onto the circuit board 50 and effective in enhancing the packaging density of the circuit board 50.

Second Embodiment

A second embodiment is related to a method of manufacturing the power MOSFET 10 according to the first embodiment, and will be explained hereinafter. FIGS. 3 through 6(*a*) and 6(*b*) show the method of manufacturing the power MOSFET 10 along its manufacturing process. The present manufacturing process includes a wafer preparing process step, a terminal board forming process step, a terminal board shaping process step, a blazed or soldered layer forming process step, and a dividing process step.

Figure 3:
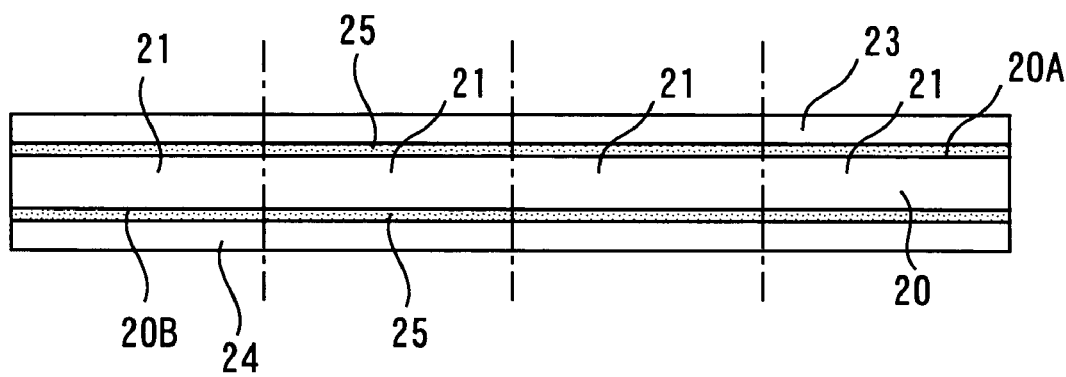
FIG. 3 shows a semiconductor wafer and a pair of terminal boards at the stage of the wafer preparing process step and the terminal forming process step according to a second embodiment of the present invention.

FIG. 3 shows a semiconductor wafer 20 and a pair of terminal boards 23, 24 at the stage of completion of the wafer preparing process step and the terminal forming process step. The semiconductor wafer 20 is a semiconductor wafer prior to the division into a plurality of the semiconductor substrates 11 shown in FIGS. 1 and 2(*a*) and 2(*b*). The semiconductor wafer 20 includes a plurality of the semiconductor substrates 11 prior to being divided. The semiconductor wafer 20 has a pair of main surfaces 20A and 20B opposite to each other. A plurality of power MOSFETs 10 are fabricated and built in the semiconductor wafer 20 in matrix form. In FIG. 3 by way of example, the semiconductor wafer 20 has four sections 21 delimited by chain lines. The semiconductor substrates 11 each shown in FIG. 1 are fabricated and built in these sections 21 respectively. In other words, each of these sections 21 corresponds to the semiconductor substrate 11 of the power MOSFET 10 shown in FIG. 1. The main surface 20A of the semiconductor wafer 20 includes the main surfaces 11A of the respective power MOSFETs 10, and the main surface 20B thereof includes the main surfaces 11B of the respective power MOSFETs 10.

Terminal boards 23 and 24 are bonded onto the main surfaces 20A and 20B of the semiconductor wafer 20 as shown in FIG. 3 with conductive adhesives 25 respectively. The terminal boards 23 and 24 are metal plates each made of Cu or Cu—Sn or Cu—Sn—Ni. The terminal board 23 is adhered onto the whole area of the main surface 20A and joined in common to the source electrodes 10S and gate electrodes 10G of the respective power MOSFETs 10 with the conductive adhesive 25 interposed therebetween. Also the terminal board 24 is adhered to the whole area of the main surface 20B and joined in common to the drain electrodes 10D of the respective power MOSFETs 10 with the conductive adhesive 25 interposed therebetween.

Figure 4:
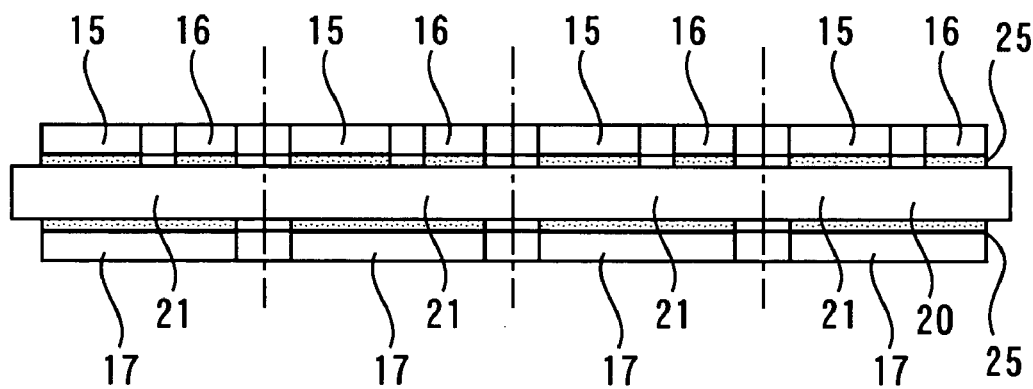
FIG. 4 shows the semiconductor wafer and a pair of shaped terminal boards after he terminal shaping process step according to another modification of the second embodiment of the present invention.
Figure 5:
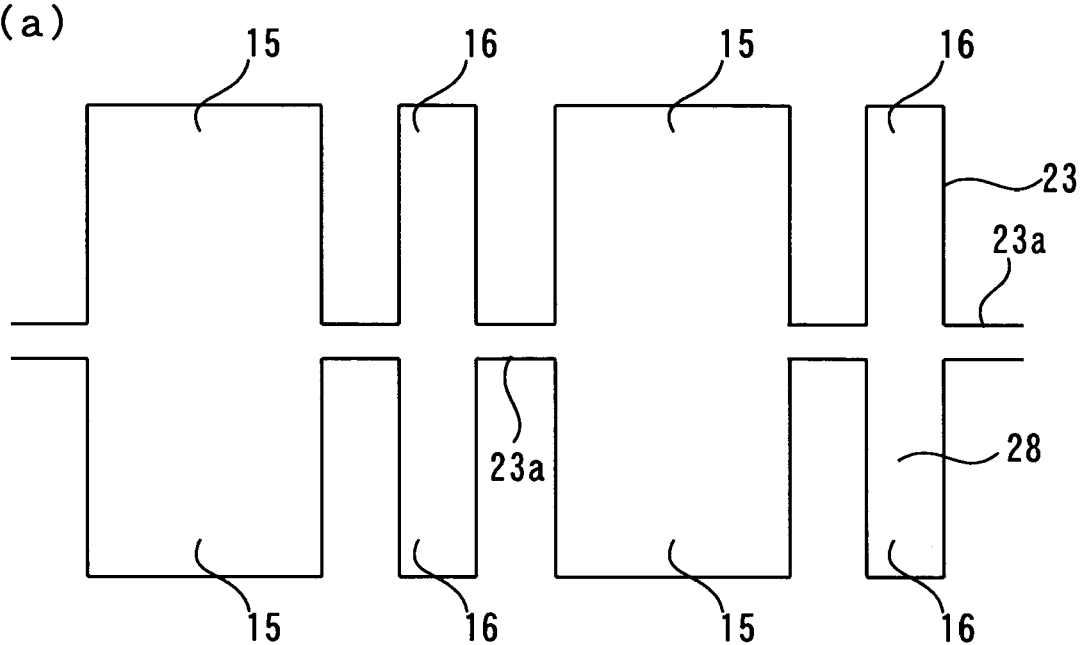
FIG. 5(a) shows an etched pattern of the terminal board on one main surface of the semiconductor wafer.
FIG. 5(b) shows an etched shaped pattern of the terminal board on the other main surface, corresponding to FIG. 4, according to a second embodiment of the present invention.
Figure 5:
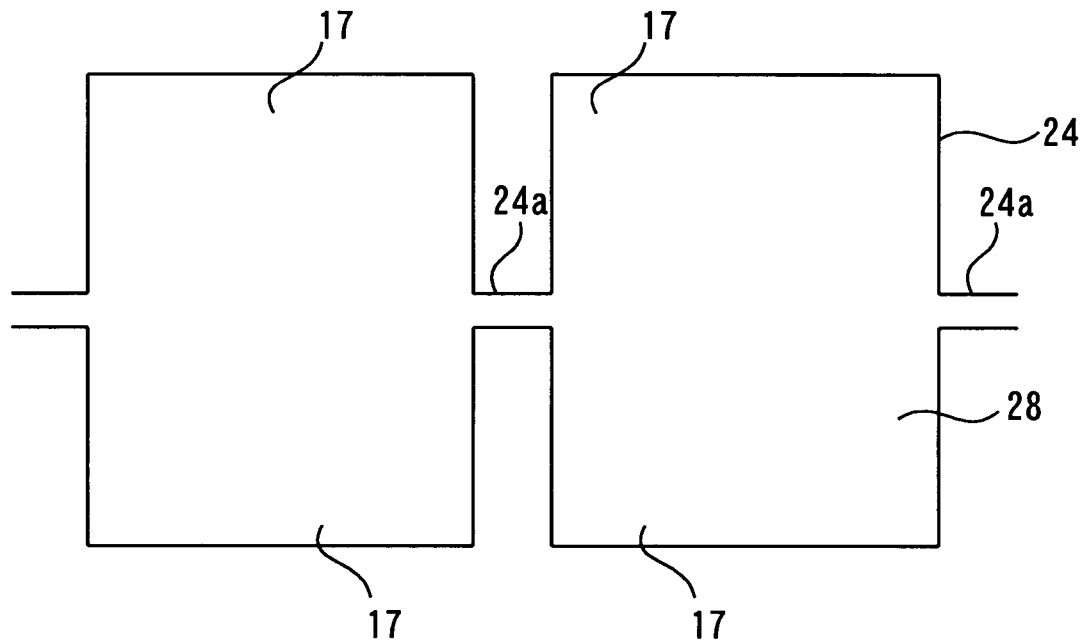

FIG. 4 shows the semiconductor wafer 20 and a pair of shaped terminal boards 23, 24 subsequent to the completion of the terminal shaping process step. In the terminal shaping process step, the terminal boards 23 and 24 are etched to predetermined patterns by photoengraving and shaped. FIG. 5(*a*) shows an etched pattern of the terminal board 23 on the main surface 20A of the semiconductor wafer 20, and FIG. 5(*b*) shows an etched shaped pattern of the terminal board 24 on the main surface 20B. FIGS. 5(*a*) and 5(*b*) both typically show the four adjacent power MOSFETs 10 contained in the semiconductor wafer 20 and illustrate the etched shaped patterns of the terminal boards 23 and 24 used in these.

The terminal board 23 shown in FIG. 5(*a*) includes the source terminal layers 15 and gate terminal layers 16 of the four respective power MOSFETs 10. These source terminal layers 15 and gate terminal layers 16 are shaped in a state in which they are being connected to one another by slender connecting pieces 23*a*. Also the terminal board 24 shown in FIG. 5(*b*) includes the drain terminal layers 17 of the four respective power MOSFETs 10. The layers 17 are shaped in a state in which they are being connected to each other by slender connecting pieces 24*a*.

A brazing layer 28 is electroplated in a state in which the terminal boards 23 and 24 have been shaped into such patterns as shown in FIGS. 5(*a*) and 5(*b*). The brazing layer 28 is a solder layer and is adhered to the surfaces of the source terminal layers 15, gate terminal layers 16, and connecting pieces 23*a* shown in FIG. 5(*a*). The layer 28 is also adhered to surfaces of the drain terminal layers 17 and connecting pieces 24*a* shown in FIG. 5(*b*). The connecting pieces 23*a* are used to connect the respective source terminal layers 15 and gate terminal layers 16 in common and to electroplate the brazing layer 28 in common to these. Also the connecting pieces 24*a* are used to connect the drain terminal layers 17 in common and to electroplate the brazing layer 28 in common to these.

Figure 6:
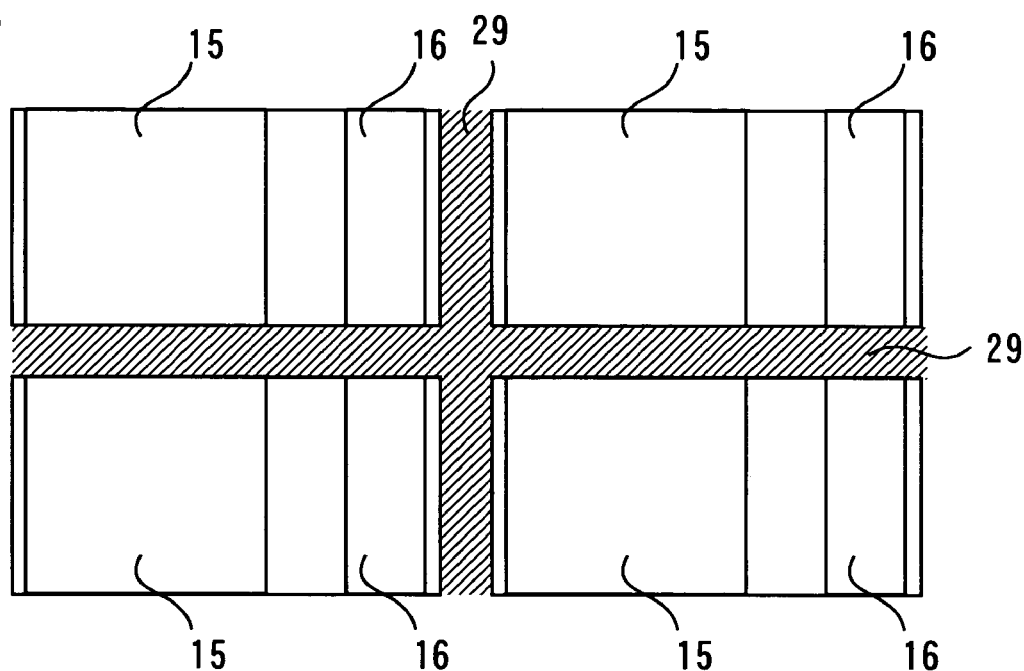
FIG. 6(a) shows a dividing state of the terminal board and the semiconductor substrate on one main surface side of the semiconductor wafer according to another modification of the second embodiment of the present invention.
FIG. 6(b) shows a dividing state of the terminal board and the semiconductor substrate on other main surface side.
Figure 6:
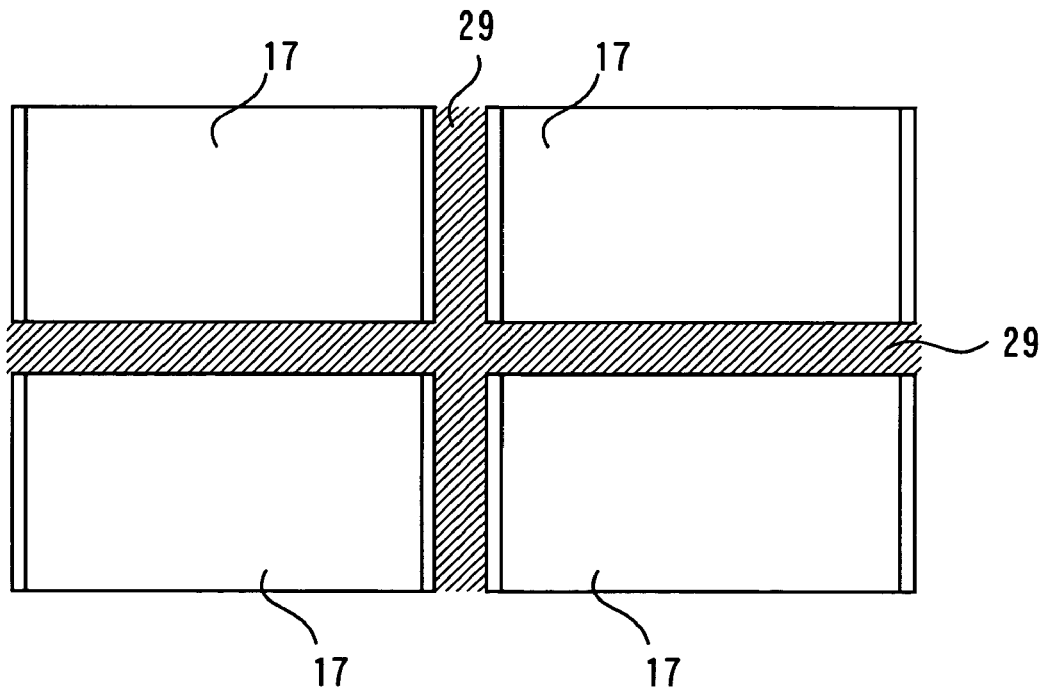

After the formation of the brazing layers 28, the dividing process step is executed. FIGS. 6(*a*) and 6(*b*) show a state subsequent to the completion of the dividing process step. In FIGS. 6(*a*) and 6(*b*), diagonally-shaded lines 29 correspond to dicing lines. The semiconductor wafer 20 is divided into the individual power MOSFETs 10 by the dicing lines 29. FIG. 6(*a*) shows a divided state of the terminal board 23 and the semiconductor substrate 11 on the main surface 20A side of the semiconductor wafer 20. FIG. 6(*b*) shows a divided state of the terminal board 24 and the semiconductor substrate 11 on the main surface 20B side. In FIGS. 6(*a*) and 6(*b*), the hatched portions or areas correspond to the dicing lines 29 respectively. The semiconductor substrate 11 is divided at the dicing lines 29, and the terminal boards 23 and 24 are respectively divided at the dicing lines 29. The source terminal layers 15 and gate terminal layers 16 are formed in the respective power MOSFETs 10 electrically independent of one another by the division of the terminal board 23. The drain terminal layers 17 are formed by dividing the terminal board 24. The connecting pieces 23a and 24a are contained in the dicing lines 29 and removed by the dividing process step, so that the respective source terminal layers 15, gate terminal layers 16, and drain terminal layers 17 become independent of one another.

The so-divided each individual power MOSFET 10 is packaged on the circuit board 50 in the state shown in FIG. 1 and sealed with the resin material 60. Prior to the sealing thereof with the resin material 60, brazing is done by means of the brazing layers 28 adhered to the surfaces of the source terminal layers 15, gate terminal layers 16, and drain terminal layers 17. This brazing is achieved by heating the power MOSFET 10 on the circuit board 50 to thereby melt the brazing layers 28 and fixing it with the brazing materials 18 shown in FIG. 1.

Third Embodiment

Figure 7:
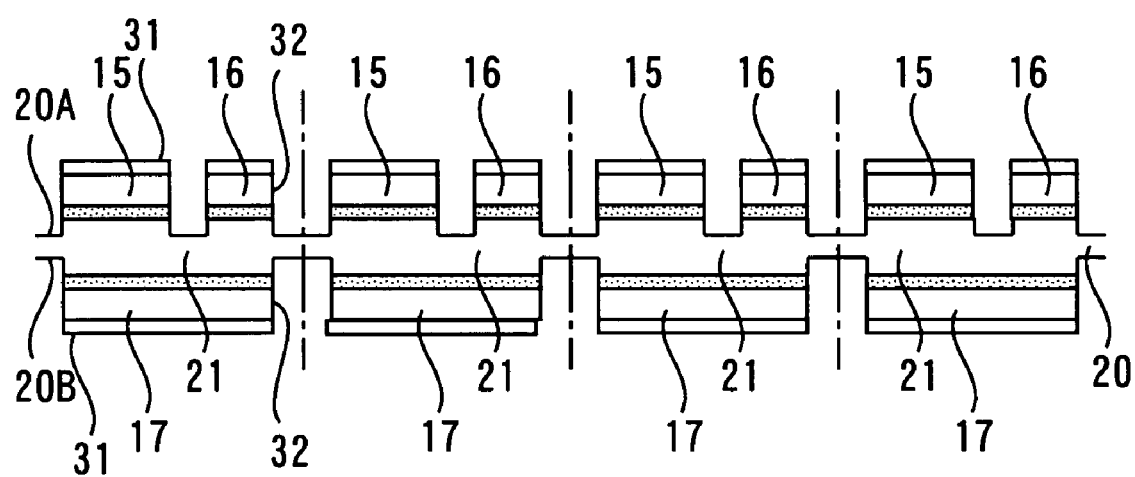
FIG. 7 shows a semiconductor wafer subsequent to the completion of a terminal board shaping process step employed in the third embodiment of the present invention.

FIGS. 7, 8(a), 8(b), 9(a), and 9(b) show a third embodiment related to the method of manufacturing the power MOSFET 10 according to the present invention. The third embodiment is fabricated in the same way as the second embodiment up to the terminal forming process step shown in FIG. 3. FIG. 7 shows a semiconductor wafer 20 subsequent to the completion of a terminal shaping process step employed in the third embodiment.

In the third embodiment, brazing layers 31 are adhered to the whole surfaces of the terminal boards 23 and 24 after the terminal forming process step shown in FIG. 3. The brazing layers 31 are respectively constituted of Sn—Pb, Sn—Bi, Sn—Cu, or Sn and adhered to the whole surfaces of the terminal boards 23 and 24 by a vapor deposition method. After the formation of the brazing layers 31, the terminal board shaping process step is effected on the terminal boards 23 and 24.

In the terminal shaping process step employed in the third embodiment, the semiconductor wafer 20 is half-cut along isolation lines 32 without depending on etching. Owing to the half-cutting, the terminal boards 23 and 24 are shaped. In the present half-cutting, as shown in FIG. 7, the terminal boards 23 and 24, the conductive adhesives 25, and the surface portions of the wafer 20 are respectively cut along the isolation lines 32 up to positions to divide the terminal boards 23 and 24 and the conductive adhesives 25, and the brazing layers 31 evaporated onto the isolation lines 32 are also removed.

Figure 8:
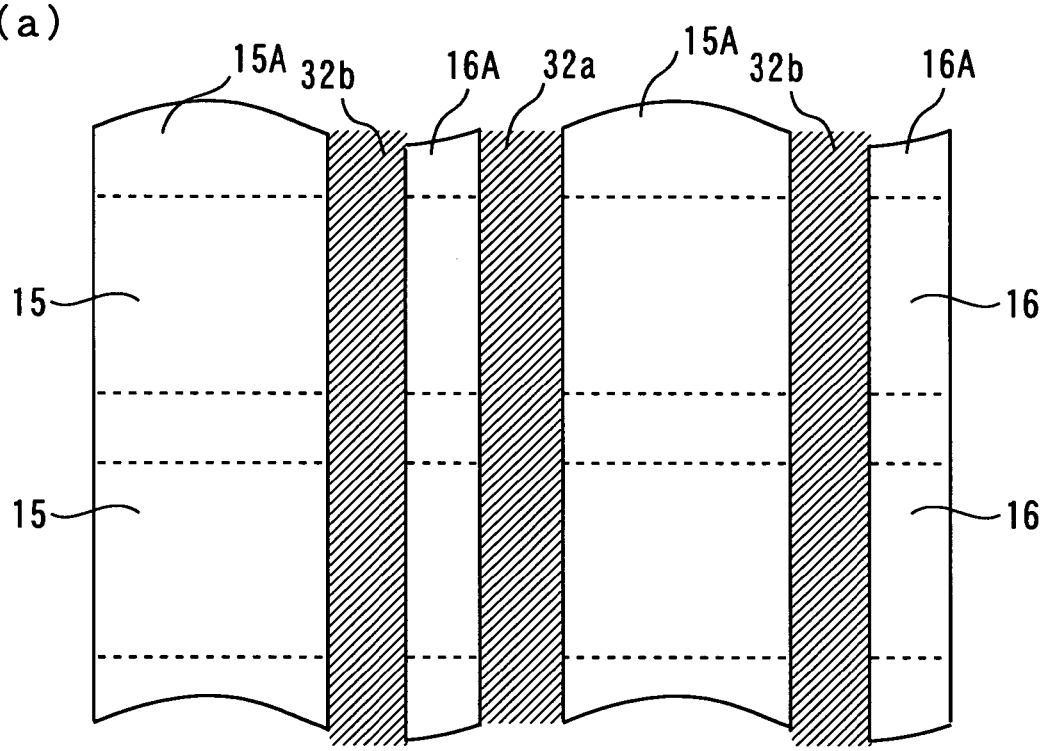
FIGS. 8(a) and 8(b) show the semiconductor wafer subsequent to the completion of the terminal board shaping process step, corresponding to FIG. 7, according to a third embodiment of the present invention.
Figure 8:
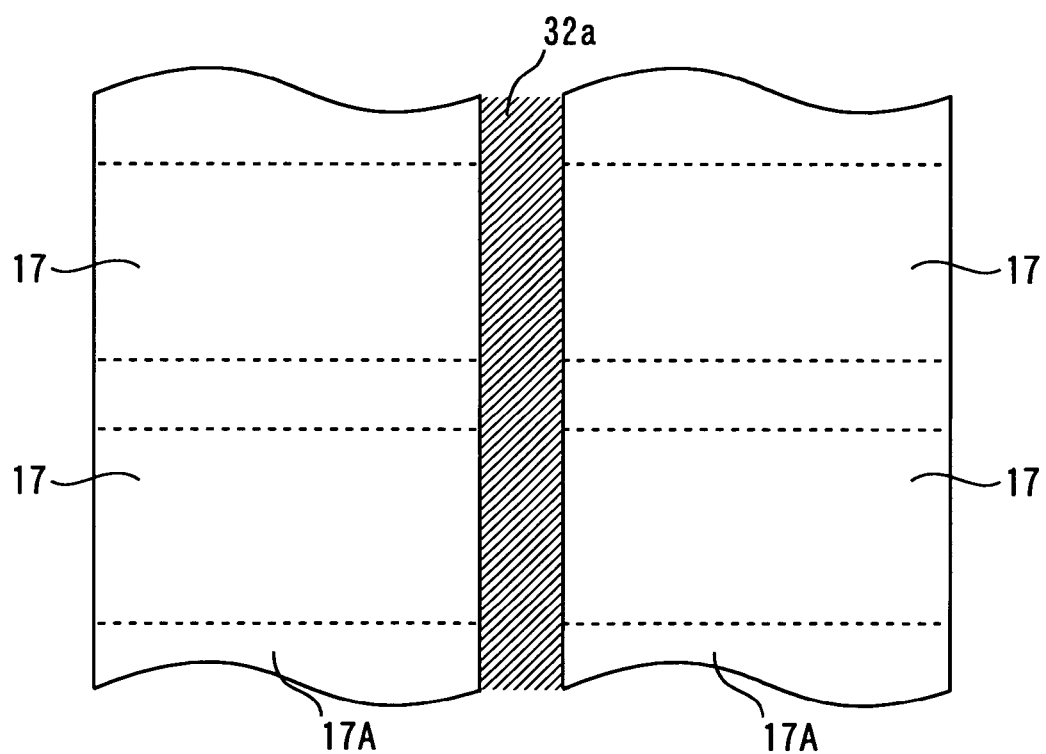

FIGS. 8(a) and 8(b) show the semiconductor wafer 20 subsequent to the completion of the terminal board shaping process step. FIG. 8(a) typically illustrates the terminal board 23 for the four adjacent power MOSFETs 10 on the main surface 20A thereof. FIG. 8(b) typically depicts the terminal board 24 for the four adjacent power MOSFETs 10 on the main surface 20B thereof.

The isolation lines 32 contain isolation lines 32a for separating the terminal board 23 along one direction on the main surface 20A side and isolation lines 32b extending in parallel with these isolation lines 32a. Also the isolation lines 32 include isolation lines 32a for separating the terminal board 24 along one direction on the main surface 20B side. The isolation lines 32a of the main surfaces 20a and 20b are placed in positions opposite to one another with the semiconductor wafer 20 interposed therebetween. A plurality of source terminal strips 15A and gate terminal strips 16A are formed in the main surface 20A by half cuts extending along these isolation lines 32a and 32b. Further, a plurality of drain terminal strips 17A are formed in the main surface 20B. The source terminal strip 15A, the gate terminal strip 16A, and the drain terminal strip 17A include a plurality of source terminal layers 15, gate terminal layers 16, and drain terminal layers 17 along the dicing lines 32a and 32b, respectively.

Figure 9:
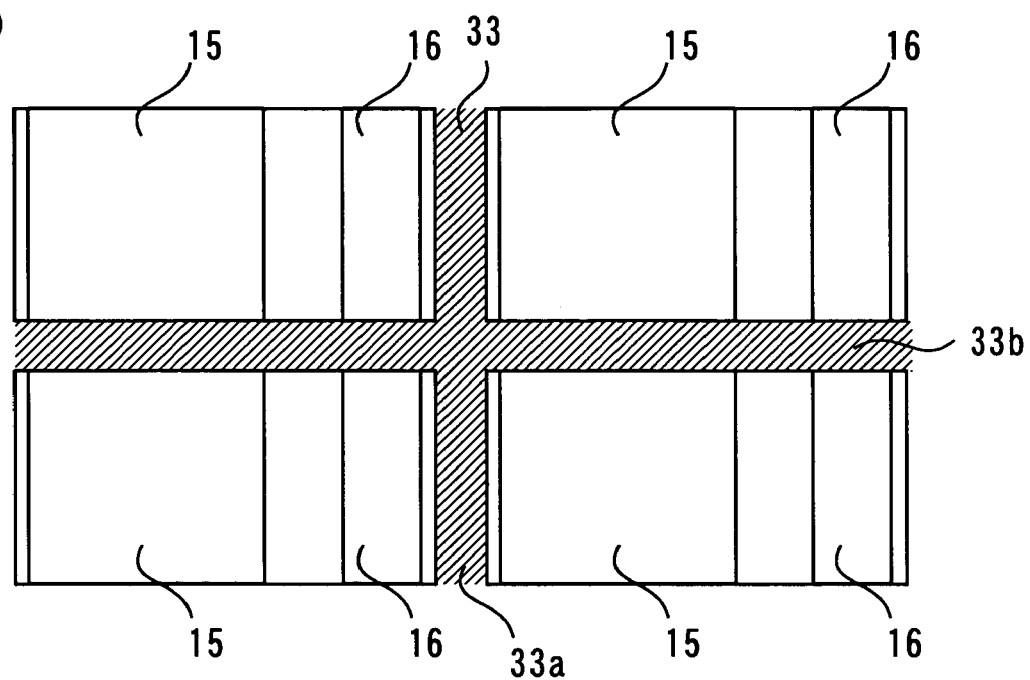
FIGS. 9(a) and 9(b) show a half cutting state along the isolation lines according to another modification of the third embodiment of the present invention.
Figure 9:
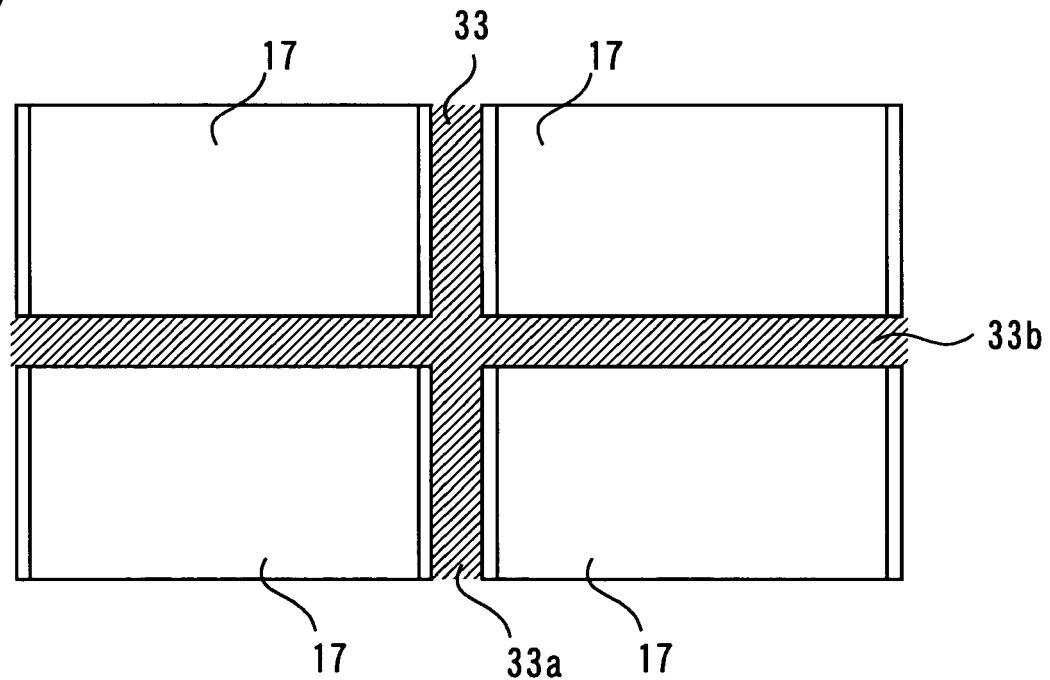

In the third embodiment, the semiconductor wafer 20 is fully cut along such dicing lines 33 as shown in FIGS. 9(a) and 9(b) after the half cutting of the isolation lines 32 shown in FIGS. 7, 8(a), and 8(b). FIG. 9(a) typically shows the four adjacent power MOSFETs 10 placed on the main surface 20A side of the wafer 20, and FIG. 9(b) typically illustrates the four adjacent power MOSFETs 10 placed on the main surface 20B side. The dicing lines 33 respectively include dicing lines 33a coincident with the isolation lines 32a and dicing lines 33b normal to these lines. The dicing lines 33b divide the source terminal strips 15A, the gate terminal strips 16A, and the drain terminal strips 17A into the source terminal layers 15, gate terminal layers 16, and drain terminal layers 17 corresponding to the respective power MOSFETs 10. Owing to the full-cut dicing by the dicing lines 33, the wafer 20 is divided into the individual power MOSFETs 10 over its whole thickness.

In the third embodiment, the brazing layers 31 are easily formed by vapor deposition without forming the connecting pieces 23a and 24a. After the formation of the brazing layers 31, isolation and dicing are done along the isolation lines 32 and the dicing lines 33. Therefore, the brazing layers 31 on the source terminal layers 15, gate terminal layers 16, and drain terminal layers 17 are isolated and divided or segmented together with the source terminal layers 15, gate terminal layers 16, and drain terminal layers 17, thus making it possible to divide the semiconductor wafer 20.

Fourth Embodiment

In the present fourth embodiment, power MOSFETs 10 are configured wherein end portions of source terminal layers 15, gate terminal layers 16, and drain terminal layers 17 are covered by a resin mask respectively.

Figure 10:
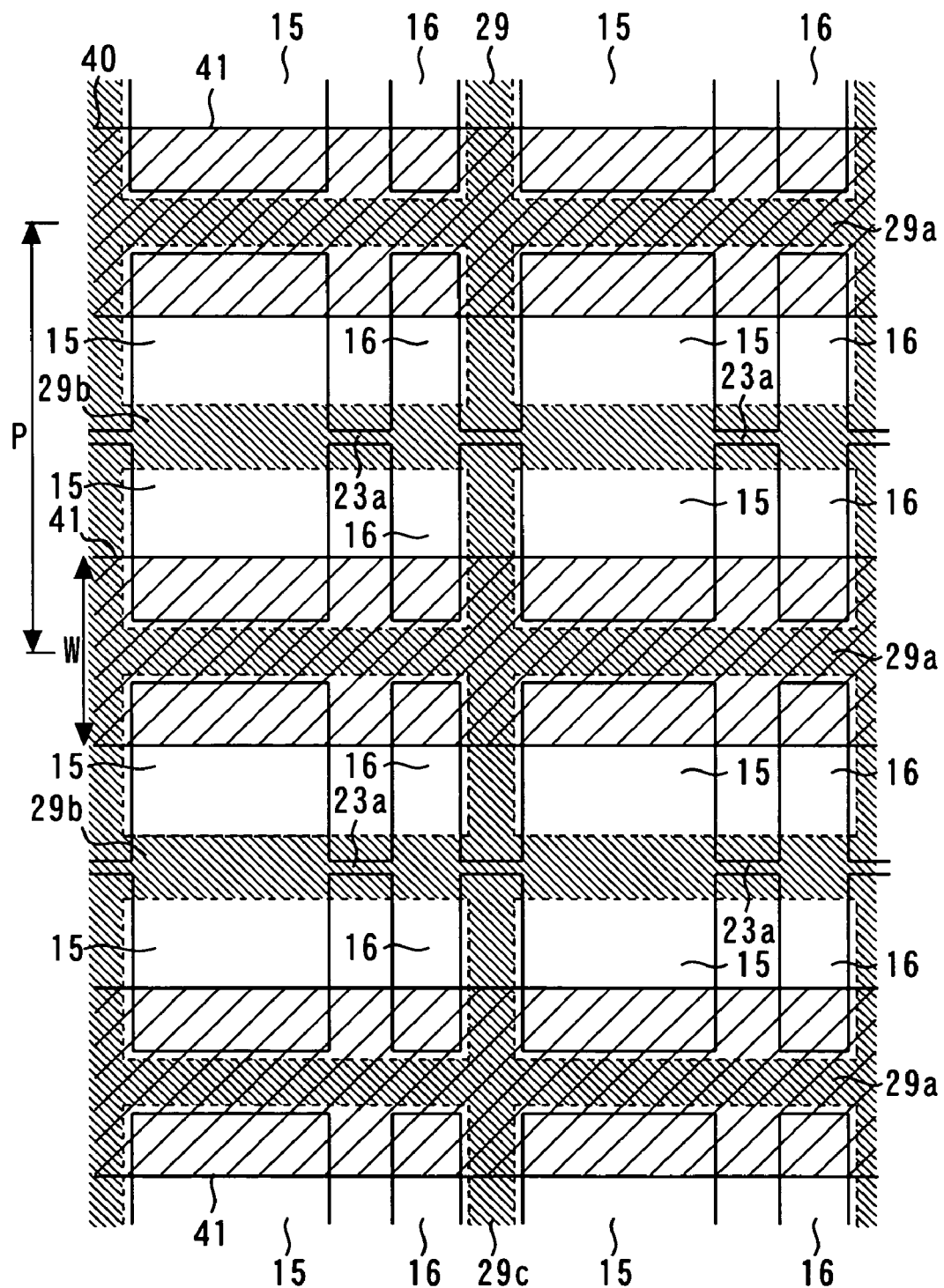
FIG. 10 shows a resin mask that includes a plurality of resin bands according to the third embodiment of the present invention.

In the fourth embodiment, a resin mask 40 is applied in the state shown in FIGS. 5(a) and 5(b) where the source terminal layers 15, gate terminal layers 16, and drain terminal layers 17 have been formed together with the connecting pieces 23a and 24a. As shown in FIG. 10, the resin mask 40 includes a plurality of resin bands 41. These respective resin bands 41 are mounted so as to extend in the transverse direction with predetermined pitches P. Let's assume that the width of each resin band 41 is W. The pitch P is set between the two adjacent resin bands 41 in such a manner that a plurality of power MOSFETs 10 arranged in two rows in the transverse direction are laid out.

After the mounting of the resin mask 40, the semiconductor wafer 20 is divided along dicing lines 29. The dicing lines 29 includes dicing lines 29a and dicing lines 29b extending in the transverse direction, and dicing lines 29c extending in the transverse direction along the center positions of the resin bands 41. The dicing lines 29b extend in the transverse direction along the positions of the connecting pieces 23a and 24a. The dicing lines 29c extend in the vertical direction. Each individual power MOSFET 10 is divided by the dicing lines 29. In the respective power MOSFETs 10, the respective ends of the source terminal layers 15, gate terminal layers 16, and drain terminal layers 17 are coated with the resin bands 41 respectively. Each of the resin bands 41 has the effect of enhancing reliability of each terminal layer.

Fifth Embodiment

The present fifth embodiment is related to another method of manufacturing a power MOSFET according to the present invention. The present embodiment is a manufacturing method for effecting direct vapor deposition on source electrodes 10S, gate electrodes 10G, and drain electrodes 10D of respective power MOSFETs 10 to form source terminal layers 15, gate terminal layers 16, and drain terminal layers 17 with respect to a semiconductor wafer 20 including the plural power MOSFETs 10.

In FIG. 3, the semiconductor wafer 20 prior to forming the terminal boards 23 and 24 and the conductive adhesives 25 include the plurality of power MOSFETs 10. The wafer 20 is placed in the state in which the source electrodes 10S and the gate electrodes 10G of the respective power MOSFETs 10 are exposed at the main surface 20A and their drain electrodes 10D are exposed at the main surface 20B. In the fifth embodiment, with reference to FIG. 1 and FIG. 2, Cu is thickly evaporated directly onto the source electrodes 10S and gate electrodes 10G exposed at the main surface 20A and the drain electrodes 10D exposed at the main surface 20B to thereby form their corresponding source terminal layers 15, gate terminal layers 16, and drain terminal layers 17 jointed thereto. Brazing layers 28 are evaporated onto the source terminal layers 15, gate terminal layers 16, and drain terminal layers 17. In the main surface 20A, regions other than the source electrodes 10S and the gate electrodes 10G are masked. Vapor deposition of Cu and vapor deposition of the brazing layer 28 are performed in the state in which the mask has been formed. After the vapor deposition of these, the mask is removed and the source terminal layers 15 and the gate terminal layers 16 each having the brazing layer 28 are respectively independently formed on the source electrodes 10S and the gate electrodes 10G. The source terminal layer 15, the gate terminal layer 16, and the drain terminal layer 17 respectively have areas identical to those of the source electrode 10S, gate electrode 10G, and drain electrode 10D.

After the formation of the source terminal layers 15, gate terminal layers 16, and drain terminal layers 17 each having the brazing layer 28, the process of separating the wafer is executed to divide the plurality of power MOSFETs 10 into individuals.

Even in the case of the fifth embodiment, the source terminal layers 15, gate terminal layers 16, and drain terminal layers 17 can easily be formed at a wafer stage. It is not necessary to connect terminals by thin metal wires after the separation of the individual power MOSFETs 10. Thus, each power MOSFET 10 small in size and low in internal resistance can be obtained.

Sixth Embodiment

The sixth embodiment presents a power MOSFET 10 manufactured by the manufacturing method according to the fifth embodiment. The power MOSFET 10 according to the sixth embodiment provides a source terminal layer 15, a gate terminal layer 16, and a drain terminal layer 17 respectively on a source electrode 10S, a gate electrode 10G, and a drain electrode 10D. Each terminal layer 15, 16, or 17 are identical in area to a source electrode 10S, a gate electrode 10G, or a drain electrode 10D and each having a brazing layer 28. Even by the sixth embodiment, each power MOSFET 10 small in size and low in internal resistance can be obtained.

As described above, in the present invention, the following advantages are obtained. According to the power MOSFET of the present invention as described above, outer dimensions can be made smaller and concurrently connecting resistances of respective terminals can sufficiently be reduced as the conventional one using the lead frame. The power MOSFET application device of the present invention provides the effect of being able to package the power MOSFET in a small packaging area. In addition, according to a method of manufacturing the power MOSFET of the present invention, there is no need to individually form a source terminal layer, a gate terminal layer, and a drain terminal layer on a semiconductor substrate after separation of each power MOSFET, thus making it possible to easily form these.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-142165, filed on May 20, 2003 including specification, claims, drawings and summary, on which the Convention priority of the present application is based, are incorporated herein by reference in its entirety.

The invention claimed is:

1. A power MOSFET packaged device comprising:
a power MOSFET comprising:
a semiconductor substrate having a first surface and a second surface opposite to each other, the semiconductor substrate having a source electrode and a gate electrode provided on the first surface and a drain electrode provided on the second surface; a source terminal layer disposed on the first surface and joined to the source electrode; a gate terminal layer disposed on the first surface and joined to the gate electrode; and a drain terminal layer disposed on the second surface and joined to the drain electrode; wherein the source terminal layer and the gate terminal layer are respectively disposed on the first surface with such sizes as to fall within the area of the first surface, and the drain terminal layer is disposed with such a size as to fall within the area of the second surface, and a circuit board, wherein the power MOSFET is packaged in such a manner that the respective first and second surfaces of the semiconductor substrate in the power MOSFET are substantially normal to the circuit board.

2. The power MOSFET packaged device according to claim 1 wherein the source terminal layer, the gate terminal layer, and the drain terminal layer in the power MOSFET are respectively brazed to the circuit board with brazing materials.

3. The power MOSFET packaged device according to claim 1 wherein an encapsulating reset material is provided so as to cover the semiconductor substrate, the source terminal layer, the gate terminal layer, and the drain terminal layer in the power MOSFET.

* * * * *